(12) United States Patent
Tsuchiya et al.

(10) Patent No.: US 8,034,696 B2
(45) Date of Patent: Oct. 11, 2011

(54) MANUFACTURING METHOD OF SEMICONDUCTOR DEVICE

(75) Inventors: Ryuta Tsuchiya, Hachioji (JP);
Yoshinobu Kimura, Tokyo (JP); Yusuke Morita, Hachioji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 831 days.

(21) Appl. No.: 11/802,048

(22) Filed: May 18, 2007

(65) Prior Publication Data
US 2007/0266933 A1 Nov. 22, 2007

(30) Foreign Application Priority Data
May 19, 2006 (JP) .................................. 2006-139944

(51) Int. Cl.
*H01L 21/20* (2006.01)
(52) U.S. Cl. ................................. 438/481; 257/E21.09
(58) Field of Classification Search .................. 438/448, 438/481, 503–510, 404, 413, 219; 257/E21.09, 257/E33.005
See application file for complete search history.

(56) References Cited

U.S. PATENT DOCUMENTS

| 4,522,662 | A | * | 6/1985 | Bradbury et al. | 117/90 |
| 4,601,779 | A | * | 7/1986 | Abernathey et al. | 438/459 |
| 4,760,036 | A | * | 7/1988 | Schubert | 117/89 |
| 5,321,298 | A | * | 6/1994 | Moslehi | 257/506 |

FOREIGN PATENT DOCUMENTS
JP 2000-208770 7/2000

OTHER PUBLICATIONS

Pagliaro et al (J.ElectroChem.Soc.: Solid-state science and Technology),vol. 134, No. 5;pp. 1235-1238.*
T. Mizuno et al., "Performance Fluctuations of 0.10 μm MOSFETs—Limitation of 0.1 μm ULSIs," 1994 Symposium on VLSI Technology Digest of Technical Papers, 1994, pp. 13-14.
J. Yang et al., "Electrical effects of a single stacking fault on fully depleted thin-film silicon-on-insulator P-channel metal-oxide-semiconductor field effect transistors," Journal of Applied Physics, vol. 91, No. 1, Jan. 1, 2002, pp. 420-426.
T. Yamada et al., "An Embedded DRAM Technology on SOI/Bulk Hybrid Substrate Formed with SEG Process for High-End SOC Application," 2002 Symposium on VLSI Technology Digest of Technical Papers, 2002.

* cited by examiner

*Primary Examiner* — Kiesha Bryant
*Assistant Examiner* — Ali Naraghi
(74) *Attorney, Agent, or Firm* — Miles & Stockbridge P.C.

(57) ABSTRACT

It is an object of the present invention to provide a method of manufacturing an SOI wafer at low cost and with high yield. It is another object of the present invention to provide a semiconductor device including also bulk type MISFETs used as high voltage regions and a method of manufacturing the same without using complicated processes and increasing the size of a semiconductor chip.
The method of manufacturing a semiconductor device comprises selectively epitaxially growing a single-crystal Si layer and continuously performing the epitaxial growth without bringing a substrate temperature increased during the growth to room temperature even once. An epitaxially grown surface is then etched and planarized. The substrate temperature is then cooled down to the room temperature.

3 Claims, 14 Drawing Sheets

MANUFACTURING METHOD OF SEMICONDUCTOR DEVICE

CLAIM OF PRIORITY

The present application claims priority from Japanese Application JP 2006-139944, filed on May 19, 2006, the content of which is hereby incorporated by reference into this application.

BACKGROUND OF THE INVENTION

1. Field of the Invention

The present invention relates generally to methods of manufacturing MISFETs having a stacked structure of a semiconductor, an insulator, and a metal and, more particularly, to a method of manufacturing a semiconductor device including a MISFET formed on a semiconductor substrate having an SOI (Silicon-on-Insulator) structure.

2. Description of the Related Arts

With the greater integration and greater performance achieved lately in LSI technology, further miniaturization of MISFETs (metal-insulator-semiconductor field effect transistors) has been progressed. As a result, gate length is scaled to make more conspicuous the problem of a short channel effect that involves a reduced threshold voltage Vth. The short channel effect is attributable to the fact that expansion of a depletion layer in source and drain portions of the MISFET also affects a channel portion as a result of a channel length being miniaturized. One possible approach to suppress this effect is to suppress the expansion of the depletion layer in the source and drain portions by making higher impurity concentration of the channel portion. Making higher the impurity concentration of the channel portion, however, poses a problem of a deteriorated drive current caused by carrier mobility as a result of increased impurity scattering. In addition, the higher impurity concentration increases parasitic capacitance between a substrate and source or drain, thus impeding high-speed operations of the MISFET.

Conventionally, the threshold voltage Vth of the MISFET has been controlled by the impurity concentration of a channel region. The channel impurity concentration control is relatively favorably performed by making full use of ion implantation and rapid heat treatment techniques for LSIs with a design rule of about 100-hm node.

In MISFETs with 100-nm node or subsequent one, however, the technique controlling the threshold voltage Vth by impurities in the channel involves a smaller absolute number of impurities contributing to the threshold voltage Vth per MISFET with shorter channel lengths. Therefore, variations in the threshold voltage Vth caused by statistical fluctuations can no longer be disregarded (see, for example, T. Mizuno et al., "Performance Fluctuations of 0.10 μm MOSFETs—Limitation of 0.1 μm ULSIs," Symp. on VLSI Technology 1994). There is therefore a need for a process responding to micro-devices that is capable of controlling the threshold voltage Vth of the MISFET by using also a work function of a gate electrode through the impurity concentration control for the channel portion and other methods.

To solve the foregoing problem, an SOI structure are lately gaining attention. The SOI structure uses an insulating film (e.g., an oxide silicon film) to provide complete isolation between devices. This not only suppresses soft error and latch-up and achieves greater reliability even in LSIs with greater integration, but also reduces junction capacitance of a diffusion layer. As a result, discharge/recharge from switching is reduced and the structure is advantageous in terms also of high-speed and lower power consumption applications.

The SOI type MISFET is broadly classified into two operating modes. One is a full depletion SOI, in which a depletion layer induced in a body region immediately below the gate electrode reaches a bottom surface of the body region, specifically, an interface with an embedded oxide film. The other is a partial depletion SOI, in which the depletion layer does not reach the bottom surface of the body region, leaving a neutral region.

With the full depletion SOI-MISFET, the thickness of the depletion layer immediately below the gate is limited by the embedded oxide film. There is then a substantial decrease in a depletion charge amount as compared with the partial depletion SOI-MISFET, while, instead, there is an increase in movable charge contributing to a drain current. As a result, advantageously, precipitous subthreshold characteristics (S characteristics) can be obtained.

Specifically, given the precipitous S characteristics, the threshold voltage Vth can be decreased while suppressing an offleak current. As a result, the drain current is obtained even with a low operating voltage, which makes it possible to make a MISFET that operates on, for example, 1 V or less (and a threshold voltage Vth of 0.3 V or less), thus consuming an extremely low power.

A MISFET made on an ordinary substrate has the aforementioned problem of short channel effect; however, with the full depletion SOI-MISFET, the substrate and the device are separated by the oxide film and the depletion layer does not expand, allowing substrate concentration to be lowered. As a result, reduction in the carrier mobility as a result of the increased impurity scattering can be suppressed, making for a higher drive current. In addition, in contrast to the method of controlling the threshold voltage Vth using the impurity concentration, variations in the threshold voltage Vth caused by statistical fluctuations in the number of impurities relative to a single MISFET can be reduced.

Another known art relating to the SOI-MISFET is a double gate MISFET structure as proposed, for example, in JP-A-2000-208770. In this SOI-MISFET, a source diffusion layer and a drain diffusion layer are formed with a dummy gate electrode in a SOI layer in a self-aligning manner. An inverted pattern trench of the dummy gate electrode is then formed and an embedded gate is next formed by ion implantation of impurities in a support substrate from the trench. A W or other metal film is thereafter selectively embedded in the trench region to thereby produce an upper gate electrode. Realizing the double gate structure should indeed be an effective means for enhancing SOI-MISFET performance; however, it is extremely difficult to embed and form a high concentration diffusion layer or the like in the support substrate without adversely affecting the SOI layer in the double gate MISFET structure based on the currently well-known technique. The double gate MISFET structure is therefore yet to find its practical applications. When considering an essential concept of the double gate MISFET structure, while leaving its manufacturing difficult out of consideration, accurate positioning of the embedded gate relative to the upper gate is a prerequisite and it is inevitably required that the embedded gate be disposed for each individual device. There is basically no such concept of a function of the embedded gate electrode being shared among a plurality of MISFETs. In super-miniature SOI-MISFETs, positioning error of the embedded gate is fatal, and directly associated with variations in the parasitic capacitance and drive current.

Endeavor to make effective use of the parasitic capacitance for stabilization of dynamic operations would therefore prove to be impractical unless variations of the capacitance are substantially suppressed. Further, the threshold voltage of the double gate structure SOI-MISFET is determined only by the work function of each material of the upper gate and the embedded gate, if an SOI layer thickness component is excluded. Accordingly, it is substantially impossible to set a threshold voltage value for each MISFET. It is also assumed that the embedded gate electrode and the upper gate electrode are connected in any region other than a MISFET active region, that is, a device isolation region. It is thus essential to achieve alignment in consideration of layout of peripheral devices.

In the aforementioned full depletion SOI-MISFET manufactured using an SOI substrate having an embedded insulating layer of 50 nm or less, preferably 10 nm or less, and a thin layer of single crystal semiconductor of 20 nm or less, application of a gate potential to a well diffusion layer immediately below the SOI-MISFET results in following. Specifically, high potential application of the well potential via the thin embedded insulating film further accelerates a conductive state of the SOI-MISFET, resulting in a substantial increase in the drive current, specifically, generation of a large current. If a low gate potential is applied, the well potential follows to drop, allowing the SOI-MISFET to reach a nonconductive state quickly. More specifically, in the aforementioned operating mode, characteristics can be achieved of increasing the drive current further under the same leak current condition, thus enabling switching between conductive and nonconductive states at higher speeds. Insulation isolation of a side surface of the well diffusion layer contributes to a reduced parasitic capacitance, specifically, to a delay time constant of an applied signal. In addition, the thinner the embedded insulating film, the more effective in enhancing the effect of increasing the drive current. Ideally, film thickness condition should preferably be equivalent to that of the gate insulating film of the SOI-MISFET.

As described above, the application of the thin embedded insulating film to the SOI-MISFET permits utilization of substantial performance enhancement characteristics of the double gate structure SOI-MISFET. Further, the well diffusion layer immediately below the SOI-MISFET is formed under the gate electrode in the self-aligning manner. It is therefore possible to eliminate substantially the problem of variations in the drive current and the parasitic capacitance arising from positioning error of the embedded gate electrode which was a problem with the known double gate MISFET structure.

As described above, the SOI type MISFET has outstanding characteristics of low power consumption and high speed.

SUMMARY OF THE INVENTION

The SOI type MISFET described heretofore, however, has the following problems. The SOI substrate used for making the SOI type MISFET is generally extremely expensive as compared with a bulk substrate used conventionally. Types of SOI substrates that are available include, for example, SIMOX (Separation-by-Implantation Oxygen) substrates and Smart Cut substrates. The SIMOX substrate is made as follows. Specifically, oxygen ions are implanted in a surface of a Si substrate through ion implantation. Silicon and oxygen are then reacted with each other through annealing at high temperature, thereby forming an embedded oxide film (BOX layer: Buried Oxide) in the substrate to make the SOI substrate. The Smart Cut substrate, on the other hand, is made by a combination of a delamination method through hydrogen ion implantation and a lamination. In either type, the manufacturing process is complicated, resulting in a high substrate cost. There is therefore a problem that LSIs made using the SOI substrates require a high manufacturing cost as compared with those made using bulk substrates.

To achieve reduction in cost, attempts have conventionally been made to make the SOI structure on the bulk substrate by using ELO (Epitaxial Lateral Overgrowth), SPE (Solid Phase Epitaxy), and other epitaxial thin film growth techniques. FIGS. 1A through 1F show a flow of forming the ELO. In the ELO, an embedded oxide film layer 2 is first formed on a Si substrate 1 through thermal oxidation. The oxide film is then subjected to patterning, using photoresist, so that a surface of the Si substrate 1 is partially exposed (FIG. 2A). Si is then made to undergo selective epitaxial growth. At this time, a grown Si 3 grows not only longitudinally, but also laterally with the exposed Si substrate as a seed. As a result, the epitaxial growth occurs also on the oxide film which has undergone patterning (FIG. 2B). The growth continues until Si covers the entire surface of the oxide film (FIG. 2C). The surface is then planarized through grinding by a CMP (Chemical Mechanical Polishing) method or the like to form the SOI substrate. The very use of the CMP in this technique leads to an increased cost. MISFETs of the design rule with 100-nm node or subsequent one require that the SOI layer of 50 nm or less be formed with good uniformity. Disadvantageously, the foregoing technique using the CMP has problems in controllability and uniformity of the film thickness and thus finds it difficult to achieve the aforementioned design rule. In addition to the uniformity problem, the conventional ELO method entails a problem of defects that occur in the manufactured SOI structure. FIGS. 3A and 3B are views showing a cross section of an SOI structure manufactured through the conventional ELO. As evident from FIGS. 3A and 3B, a stacking fault occurrence region 61 is noted within the structure. The following reasons are considered to be attributable to the stacking fault. A Si (100) substrate 60 is typically used for the substrate. During a process of selective epitaxial growth 62 of Si on the Si (100) substrate 60, a facet of a surface with a slow (110) growth speed is formed on the surface of the substrate as shown in FIG. 2C due to different longitudinal and lateral growth speeds involved. If the Si epitaxial growth is stopped for cooling with such a facet existing, stress occurs in the process of cooling. This results in the stacking fault occurrence region 61.

SEM photos showing an SOI type MISFET formed on a bulk substrate by using the conventional ELO method are introduced in J. Yang et al., "Electrical effects of a single stacking fault on fully depleted thin-film silicon-on-insulator P-channel metal-oxide-semiconductor field-effect transistors," J. Appl. Phys., 91, 2002, p. 420. As evident from this document, the manufactured SOI type MISFET has a stacking fault. From the foregoing discussion, it is difficult to suppress stacking faults and manufacture a SOI structure offering a high crystal quality as long as the conventional ELO method is used and surface flattening is performed using the CMP.

The MISFET manufactured on the SOI substrate generally develops degradation of source-drain blocking voltage, thus limiting its application only to a low voltage region. It has been difficult to form high blocking voltage devices or ESD protective devices for preventing ESD (electrostatic discharge) breakdown on the SOI substrate. The natural consequence is the use of the bulk substrate, instead of the SOI substrate, for the regions used with high blocking voltages. If the bulk silicon substrate and the SOI substrate are to be used, therefore, two different substrates are required. The region occupied by the substrates then cannot be made small, which eventually results in inability to making the entire semiconductor device small. Further, as mentioned, for example, in T. Yamada et al., "An Embedded DRAM Technology on SOI/Bulk Hybrid Substrate Formed with SEG Process for High-End SOC Application," Symp. on VLSI Technology, 2002, if the SOI type MISFET and the bulk type MISFET are to be made on a single substrate, the selective epitaxial growth technique becomes necessary and, at the same time, the SOI type MISFET and the bulk type MISFET must be manufactured through different processes. This poses a problem of complicating the processes.

In light of the foregoing known difficulties with the prior art, it is an object of the present invention to provide a manufacturing method capable of manufacturing an SOI wafer having an SOI layer with a high crystal quality at low cost and with high yield. It is another object of the present invention to provide a manufacturing method capable of manufacturing semiconductor devices compactly using steps not complicated even for semiconductor devices including also bulk type MISFETs used as high voltage regions.

The foregoing objects of the present invention can be achieved by a method of manufacturing semiconductor devices including the following steps. The steps are, specifically: forming a first insulator layer on a surface of a semiconductor substrate; patterning a first mask member deposited on the first insulator layer into a desired shape; forming a first window, through which the surface of the semiconductor substrate is exposed, by selectively removing the first insulator layer using the patterned first mask member; introducing the semiconductor substrate into a chamber for performing an epitaxial growth and epitaxially growing, as a first substep of the epitaxial growth, the surface of the semiconductor substrate exposed through the first window as a seed crystal to thereby fill the first window with a first epitaxial layer including a semiconductor layer; epitaxially growing, as a second substep of the epitaxial growth, a second epitaxial layer such that the first epitaxial layer and the first insulator layer are covered, in a condition in which the semiconductor substrate is retained in the chamber, subsequent to the first substep of epitaxial growth; and etching to flatten the second epitaxial layer in the condition in which the semiconductor substrate is retained in the chamber, subsequent to the second substep of the epitaxial growth. The second substep of the epitaxial growth and the etching are performed without allowing a temperature in the chamber during the second substep of the epitaxial-growth and the etching to be decreased from a temperature of the chamber during the first substep of epitaxial growth.

To solve the foregoing problems, the inventors have tried a variety of approaches concerning the manufacture of the SOI structure by the ELO method. As a result, the inventors have found that an epitaxial growth surface is planarized as shown in FIGS. 4A and 4B through the step of etching and flattening of the epitaxial growth surface in an HCl or hydrogen gas ambience, carried out consecutively following growth of a single-crystal Si layer through selective epitaxial growth. It has been found that the etching and flattening process consecutively performed on the epitaxial growth surface without allowing, even once, the temperature of the substrate, increased during growth, to cool down to room temperature makes a facet formed during the epitaxial growth disappear. It has further been found that letting the substrate temperature cool down to the room temperature after the substrate surface has been planarized allows the aforementioned effect of stress arising from the facet shape to be suppressed, making it possible to form the SOI structure having no stacking faults as shown in an enclosure 70 in FIGS. 4A and 4B. The present invention has been completed based on the foregoing findings.

According to the foregoing aspects of the present invention, the SOI structure can be formed on the bulk substrate. The SOI substrate can therefore be provided at low cost. The substrate surface is planarized through the hydrogen annealing offering high film thickness controllability without using the CMP method. The SOI layer offering a high crystal quality free from crystal defects can therefore be formed uniformly. As a result, SOI substrates can be manufactured at low cost and with high yield. In addition, according to the aspects of the present invention, the SOI region and the bulk region can coexist on a single substrate. This allows the high blocking voltage devices and ESD protective devices for preventing ESD (electrostatic discharge) breakdown to be formed as a bulk type MISFET on the same substrate. This helps reduce a region occupied by substrates, as compared with an arrangement in which the SOI type MISFET, which offers the outstanding characteristics of low power consumption and high speed, and the bulk type MISFET are formed on respective substrates and then connected together to each other. Moreover, the processes for manufacturing the SOI type MISFET and the bulk type MISFET are used in common, which realizes the manufacture of both wafers without making the processes complicated.

BRIEF DESCRIPTION OF THE DRAWINGS

The present invention will be better understood, and further objects, features, and advantages thereof will become more apparent from the following description of preferred embodiments, taken in conjunction with the accompanying drawings in which.

DETAILED DESCRIPTION OF THE PREFERRED EMBODIMENTS

Figure 1A:
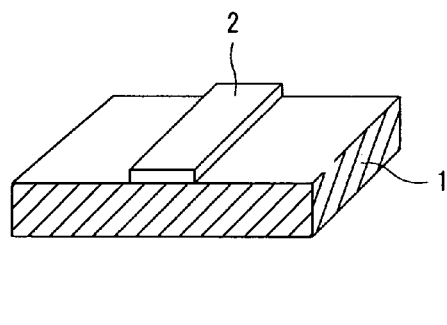
FIGS. 1A through 1F are views illustrating steps for manufacturing an SOI substrate according to a first embodiment of the present invention.
Figure 1D:
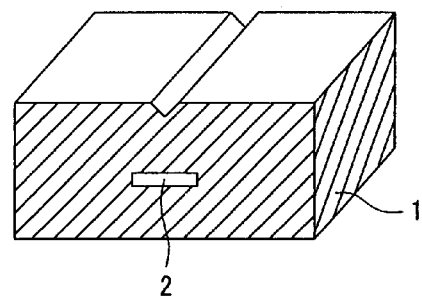

It is to be understood that the preferred embodiments of the present invention to be described hereunder will be described in a plurality of sections or embodiments as may be necessary for convenience sake. Each of the plurality of sections or embodiments is related to each other, a first one having a modified, detailed, or complementary relationship with a part or all of a second one.

It is also to be understood that, when mention is made of a number or the like (including quantity, numerical value, amount, and range) of elements in the preferred embodiments of the present invention to be described hereunder, the number is not limited to a specific one mentioned therein and may be more or less than the specific one, unless otherwise explicitly specified or principles apparently limit the number to a specific one.

It is further to be understood that, in the preferred embodiments of the present invention to be described hereunder, component members (including element steps and the like) are not essential, unless otherwise explicitly specified or principles apparently require the members.

It is further to be understood that, in the preferred embodiments of the present invention to be described hereunder, when mention is made of shapes or positional relationships of component members, such shapes or positional relationships include those that are substantially approximated or similar to the subject shapes or positional relationships unless otherwise-explicitly specified or principles apparently work otherwise. This is also true with the aforementioned numerical value and range.

In each of the accompanying drawings illustrating the preferred embodiments of the present invention, components which are constructed identically in different preferred embodiments are assigned identical reference numerals and are not discussed in duplicate.

Specific embodiments to which the present invention is applied will be described below with reference to the accompanying drawings. It should be understood that materials used in different component members, conductivity type, manufacturing conditions, and the like are not limited only to those described in the embodiments. Those skilled in the art will recognize various changes, modifications, additions and applications other than those specifically mentioned herein without departing from the spirit of this invention.

First Embodiment

FIGS. 1A through 1F are views illustrating steps for manufacturing an SOI structure according to a first embodiment of the present invention. For the sake of convenience, the conductivity type of semiconductor substrates and semiconductor films is fixed; however, specific conductivity types may be combined in any arbitrary ways and are not limited to those described in the embodiments.

Figure 1B:
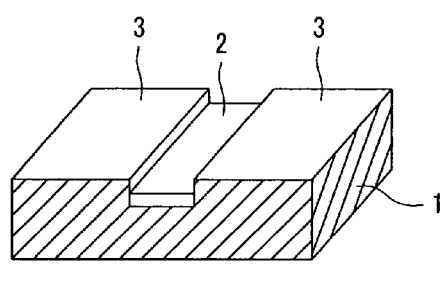
Figure 1E:
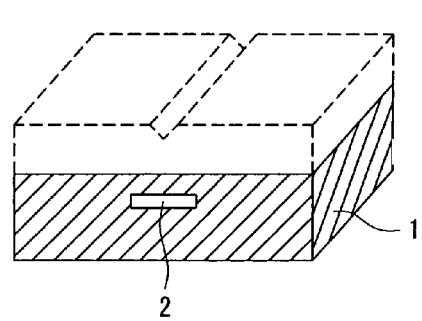
Figure 1C:
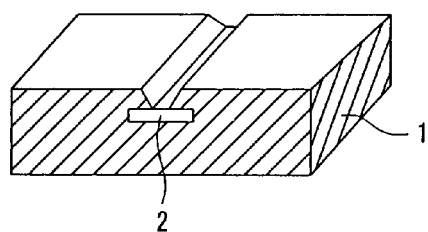
Figure 1F:
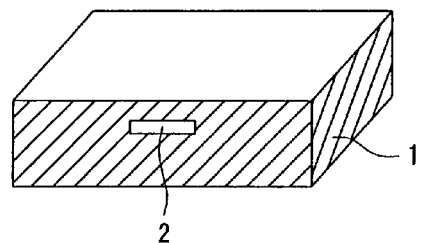
Figure 2A:
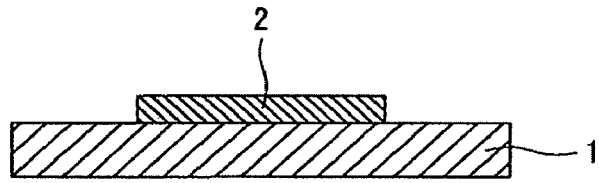
FIGS. 2A through 2D are views illustrating steps for manufacturing an SOI substrate according to a conventional ELO method.
Figure 2B:
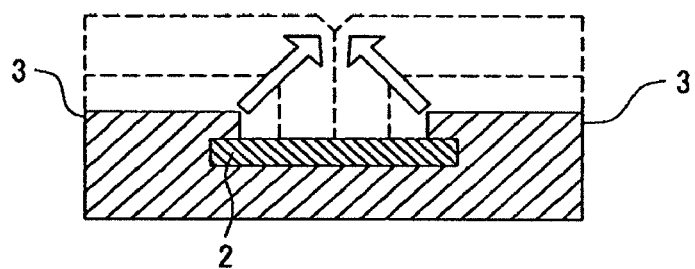
Figure 2C:
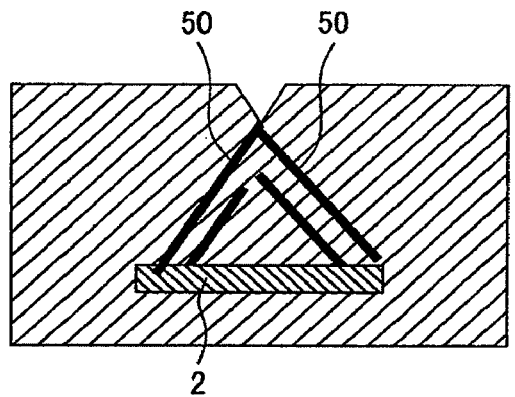
Figure 2D:
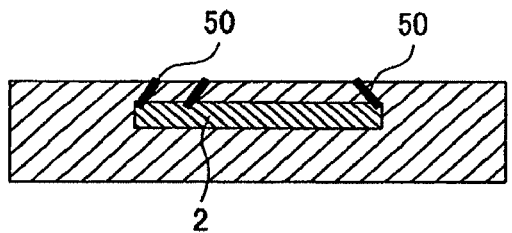
Figure 3A:
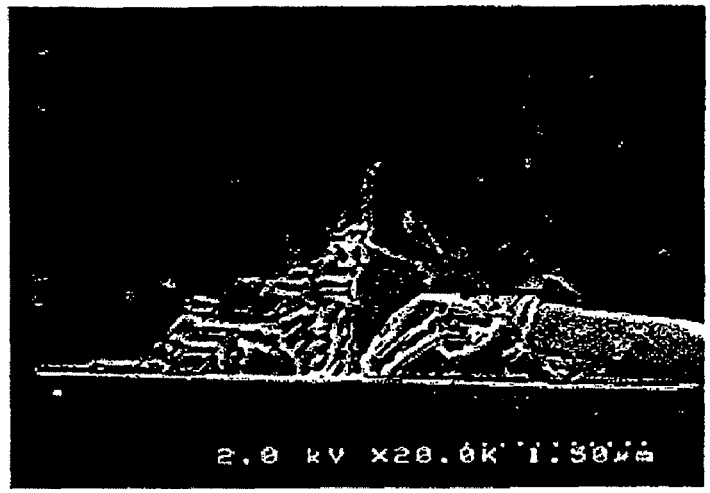
FIG. 3A is a view showing a cross-sectional SEM image of the SOI substrate manufactured, using the conventional ELO method.
Figure 3B:
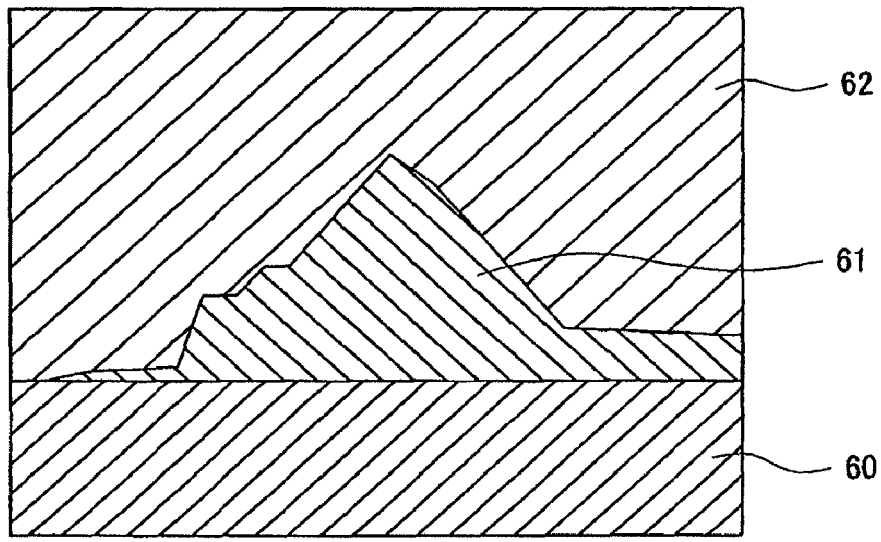
FIG. 3B is a view illustrating the cross-sectional SEM image of the SOI substrate manufactured, using the conventional ELO method.
Figure 4A:
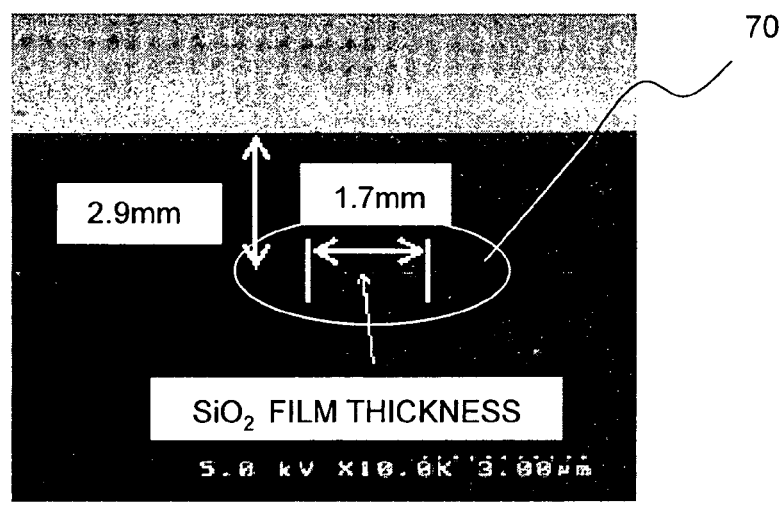
FIG. 4A is a view showing a cross-sectional SEM image of the SOI substrate manufactured according to the first embodiment of the present invention.
Figure 4B:
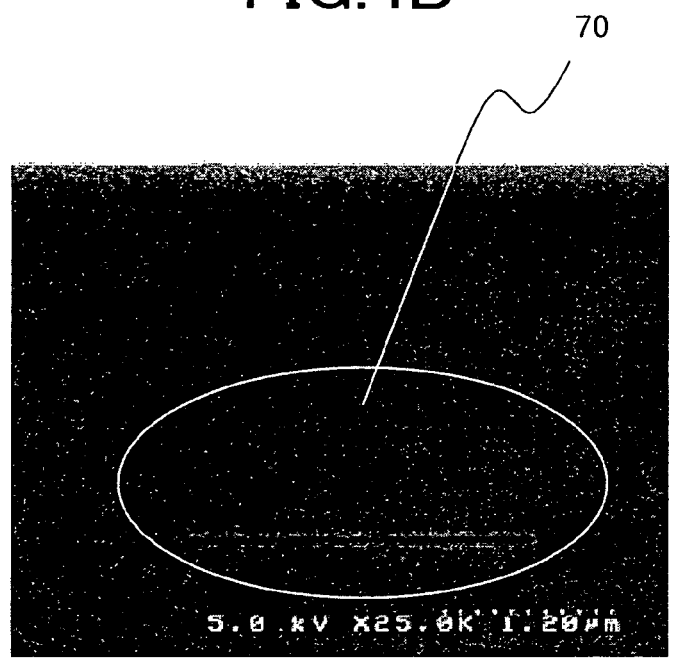
FIG. 4B is an SEM image enlarging an SOI forming region of FIG. 4A.

A silicon oxide film 2 having a thickness, for example, of 10 nm is formed as an embedded oxide film layer on a semiconductor substrate 1 including a 20-cm-diameter single-crystal Si having a plain orientation (100), P-type conductivity, and a resistivity of 10 ohm.cm and having a main surface subjected to mirror polishing. Photoresist is subsequently applied and the silicon oxide film on a region on which the SOI structure is not to be formed is selectively removed (FIG. 1A). Selective epitaxial growth of Si is then performed in two stages. It is commonly known that, in the selective epitaxial growth of Si, introducing an HCl gas during the growth process enhances selectivity on Si and the oxide film. The introduction of the HCl gas, however, promotes etching of the silicon oxide film also. It should also be noted that an etching speed builds up as a substrate temperature rises. In a patterned silicon oxide film as shown in FIG. 1A, the silicon oxide film is etched away beginning in particular with a peripheral portion thereof. In the epitaxial growth of the first stage, therefore, a Si (silicon) 3 is grown at a relatively low growth temperature of 910° C., using, for example, an $SiH_2Cl_2$ gas (gas flow rate 20 sccm), instead of the HCl gas. The growth of the first stage is stopped in a condition, in which the peripheral portion of the oxide film, which is easily etched, is covered with Si (FIG. 1B). The Si epitaxial growth is next switched to the second stage thereof using the HCl gas which offers enhanced selectivity. In this second stage of the Si epitaxial growth, an ELO growth is performed to let single-crystal Si grow on the silicon oxide film. For ELO growth conditions, a growth temperature of 990° C. is taken, using, for example, an $SiH_4$ gas (gas flow rate 20 sccm) and the HCl gas (gas flow rate 10 sccm). The growth in the second stage is stopped in a condition, in which the silicon oxide film is completely covered with Si (FIG. 1C). Si etching and flattening steps are then initiated without decreasing the substrate temperature to a low level. If the substrate temperature is lowered to room temperature at this stage with the aim of flattening the substrate by using the CMP method, a large number of stacking faults are introduced in the SOI structure due to stress involved as described earlier. To prevent this, Si is etched and planarized in a continuous cycle without the substrate temperature being decreased to room temperature at all. Etching of Si is performed until a desired SOI film thickness is reached under conditions, for example, of the HCl gas (gas flow rate 2 sccm) and a substrate temperature of 95° C. Thereafter, hydrogen annealing is performed by using an $H_2$ gas at a substrate temperature of, for example, 1155° C., thereby flattening the Si surface (FIGS. 1E and 1F). It is to be noted herein that the SOI layer should not necessarily be etched to the desired film thickness only by Si etching, using the HCl gas. In this case, the silicon oxide film, after being formed on the SOI substrate, is selectively removed by using fluorinated acid and the SOI layer is thereby thinned until the desired film thickness is reached. The use of the silicon oxide film, which has small variations in film thickness, for thinning the SOI layer enables manufacture of SOI substrates having outstanding uniformity.

The foregoing processes allow the SOI structure to be formed on the bulk substrate, which makes it possible to provide SOI substrates at low cost. Further, the substrate is planarized through hydrogen annealing that offers high film thickness controllability, without using the CMP method. This allows SOI layers having no crystal defects and offering high crystal quality to be formed highly uniformly. The hydrogen annealing carried out at high temperature provides hydrogen termination for the Si surface, thus forming an SOI/embedded oxide film interface with a small interface state. As a result, SOI substrates can be manufactured at low cost and with high yield.

Second Embodiment

Figure 5A:
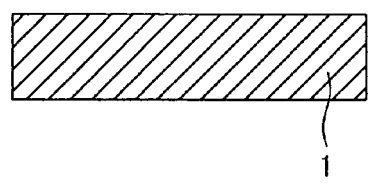
FIGS. 5A through 5G are views illustrating steps for manufacturing an SOI substrate according to a second embodiment of the present invention.
Figure 5B:
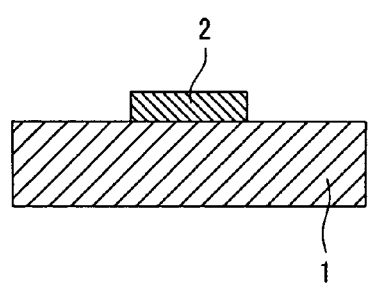

A semiconductor device according to a second embodiment of the present invention will be described below with reference to FIGS. 5A through 5G. A silicon oxide film 2 having a thickness, for example, of 10 nm is formed as an embedded oxide film layer (FIG. 5A) on a semiconductor substrate 1 including a 20-cm-diameter single-crystal Si having a plain orientation (100), P-type conductivity, and a resistivity of 10 ohm.cm and having a main surface subjected to mirror polishing. Photoresist is subsequently applied and the silicon oxide film on a region on which the SOI structure is not to be formed is selectively removed (FIG. 5B). Selective epitaxial growth of Si is then performed at a relatively low temperature region. It is commonly known that, in the selective epitaxial growth of Si, introducing the HCl gas during the growth process enhances selectivity on Si and the oxide film.

Figure 5C:
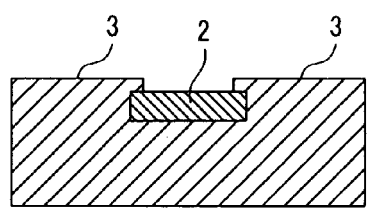
Figure 5D:
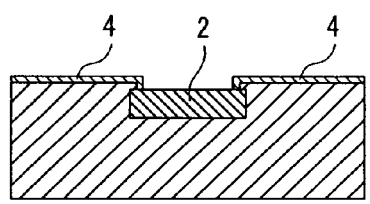

The introduction of the HCl gas, however, promotes etching of the silicon oxide film also. It should also be noted that the etching speed builds up as the substrate temperature rises. In a patterned silicon oxide film as shown in FIG. 5B, the silicon oxide film is etched away beginning in particular with the peripheral portion thereof. In the epitaxial growth of Si, therefore, a single-crystal Si layer 3 is grown at a relatively low growth temperature of 910° C., using, for example, an $SiH_2Cl_2$ gas (gas flow rate 20 sccm) instead of the HCl gas. The growth is stopped in a condition, in which the peripheral portion of the oxide film, which is easily etched, is covered with Si (FIG. 5C). A thermally-oxidized film 4 is next grown to, for example, 10 nm, so that the single-crystal Si layer 3 is covered with the thermally-oxidized film 4 (FIG. 5D). Thereafter, hydrogen annealing at a high temperature of, for example, 1050° C., is performed to etch Si.

As described above, it is possible to etch the silicon oxide film only on edge portions of the single-crystal Si layer 3 by making use of a characteristic that etching starts with a peripheral portion for a patterned silicon oxide film. From the foregoing, an opening 7 is formed (FIG. 5E) in the single-crystal Si layer 3 coated with the thermally-oxidized film 4. Si is next subjected to selective growth, using, for example, an $SiH_4$ gas (gas flow rate 20 sccm) and the HCl gas (gas flow rate 10 sccm) and under a condition of a growth temperature of 990° C. At this time, a good part of the substrate surface is covered with the silicon oxide film with Si exposed only partially. Si grows from a region of the opening 7 and Si in the reaction gas is consumed only in the region of the opening 7. Accordingly, as shown in FIG. 5F, a distribution of precipitous Si concentration is formed on the substrate surface. This distribution of Si concentration promotes lateral growth of Si. As a result, a single-crystal Si layer 5 is formed on the silicon oxide film 2 (FIG. 5G). To thin the single-crystal Si layer 5 down to a desired film thickness, the silicon oxide film, after being formed on the SOI substrate, is selectively removed by using fluorinated acid and the SOI layer is thereby thinned until the desired film thickness is reached. The use of the silicon oxide film, which has small variations in film thickness, for thinning the SOI layer enables manufacture of SOI substrates having outstanding uniformity.

The SOI structure is formed through the foregoing processes which allow the SOI structure to be formed on the bulk substrate. This makes it possible to provide SOI substrates at low cost. Further, the substrate is planarized through hydrogen annealing that offers high film thickness controllability, without using the CMP method. This allows SOI layers having no crystal defects and offering high crystal quality to be formed highly uniformly. The hydrogen annealing carried out at high temperature provides hydrogen termination for the Si surface, thus forming an SOI/embedded oxide film interface with a small interface state. As a result, SOI substrates can be manufactured at low cost and with high yield.

Third Embodiment

Figure 6A:
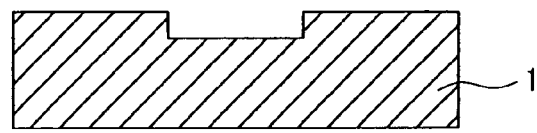
FIGS. 6A through 6D are views illustrating steps for manufacturing an SOI substrate according to a third embodiment of the present invention.
Figure 6B:
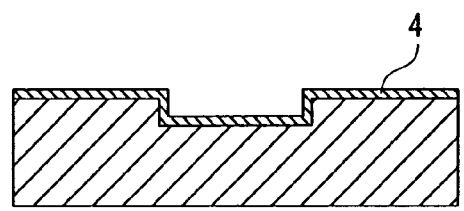
Figure 6C:
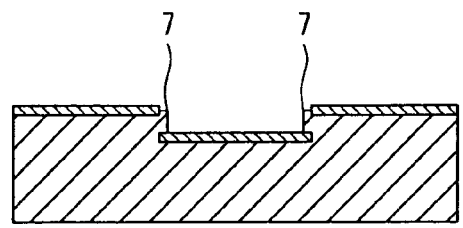
Figure 6D:
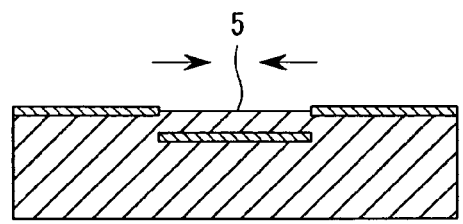

A semiconductor device according to a third embodiment of the present invention will be described below with reference to FIGS. 6A through 6D. Photoresist is applied to a semiconductor substrate 1 including a 20-cm-diameter single-crystal Si having a plain orientation (100), P-type conductivity, and a resistivity of 10 ohm.cm and having a main surface subjected to mirror polishing. The single-crystal Si is then selectively etched (FIG. 6A). A silicon oxide film 4 is subsequently formed to form an embedded oxide film layer. At this time, controlling the film thickness of the silicon oxide film 4 allows the embedded oxide film layer with a desired film thickness to be formed. Thereafter, hydrogen annealing at a high temperature of, for example, 1050° C., is performed to etch Si. As noted earlier, etching progresses from a peripheral portion for a patterned silicon oxide film. By making use of this characteristic, it is possible to etch the silicon oxide film only on edge portions of the single-crystal Si layer. From the foregoing, an opening 7 is formed (FIG. 6C) in the single-crystal Si layer 3 coated with the thermally-oxidized film 4. Si is next subjected to selective growth, using, for example, the $SiH_4$ gas (gas flow rate 20 sccm) and the HCl gas (gas flow rate 10 sccm) and under a condition of a growth temperature of 990° C. At this time, a good part of the substrate surface is covered with the silicon oxide film with Si exposed only partially. Si grows from a region of the opening 7 and Si in the reaction gas is consumed only in the region of the opening 7. Accordingly, a distribution of precipitous Si concentration is formed on the substrate surface. This distribution of Si concentration promotes lateral growth of Si. As a result, a single-crystal Si layer 5 is formed on the silicon oxide film 2 (FIG. 6D). To thin the single-crystal Si layer 5 down to a desired film thickness, the silicon oxide film, after being formed on the SOI substrate, is selectively removed by using fluorinated acid and the SOI layer is thereby thinned until the desired film thickness is reached. The use of the silicon oxide film, which has small variations in film thickness, for thinning the SOI layer enables manufacture of SOI substrates having outstanding uniformity.

The SOI structure is formed through the foregoing processes which allow the SOI structure to be formed on the bulk substrate. This makes it possible to provide SOI substrates at low cost. Further, the substrate is planarized through hydrogen annealing that offers high film thickness controllability, without using the CMP method. This allows SOI layers having no crystal defects and offering high crystal quality to be formed highly uniformly. The hydrogen annealing carried out at high temperature provides hydrogen termination for the Si surface, thus forming an SOI/embedded oxide film interface with a small interface state. As a result, SOI substrates can be manufactured at low cost and with high yield.

Fourth Embodiment

Figure 7A:
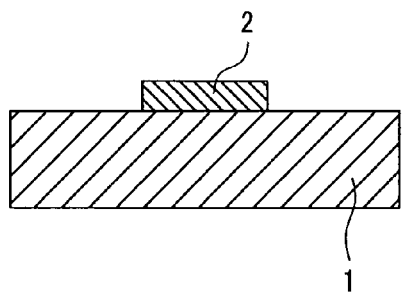
FIGS. 7A through 7F are views illustrating steps for manufacturing an SOI substrate according to a fourth embodiment of the present invention.
Figure 7D:
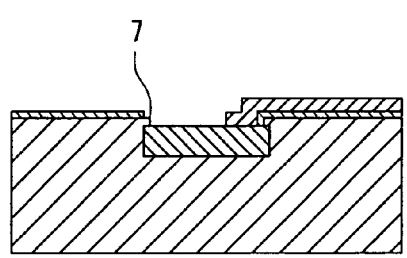
Figure 7B:
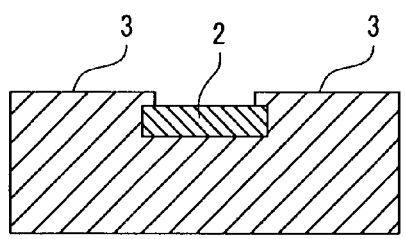
Figure 7E:
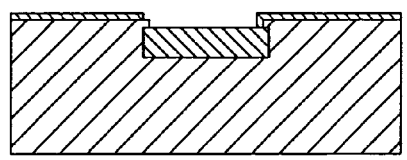
Figure 7C:
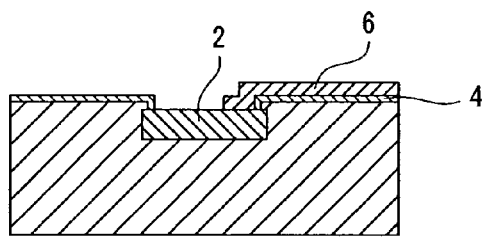
Figure 7F:
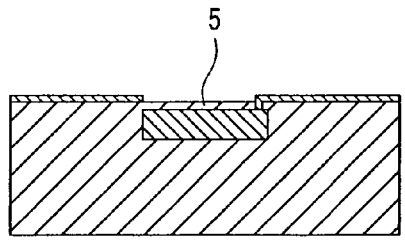

A semiconductor device according to a fourth embodiment of the present invention will be described below with reference to FIGS. 7A through 7F. A silicon oxide film 2 having a thickness, for example, of 10 nm is formed as an embedded oxide film layer on a semiconductor substrate 1 including a 20-cm-diameter single-crystal Si having a plain orientation (100), P-type conductivity, and a resistivity of 10 ohm.cm and having a main surface subjected to mirror polishing. Photoresist is subsequently applied and the silicon oxide film on a region on which the SOI structure is not to be formed is selectively removed (FIG. 7A). Selective epitaxial growth of Si is then performed at a relatively low temperature region. It is commonly known that, in the selective epitaxial growth of Si, introducing the HCl gas during the growth process enhances selectivity on Si and the oxide film. The introduction of the HCl gas, however, promotes etching of the silicon oxide film also. It should also be noted that the etching speed builds up as the substrate temperature rises. In a patterned silicon oxide film as shown in FIG. 7A, the silicon oxide film is etched away beginning in particular with the peripheral portion thereof. In the epitaxial growth of Si, therefore, a single-crystal Si layer 3 is grown at a relatively low growth temperature of 910° C., using, for example, the $SiH_2Cl_2$ gas (gas flow rate 20 sccm), instead of the HCl gas. The growth is stopped in a condition, in which the peripheral portion of the oxide film, which is easily etched, is covered with Si (FIG. 7B). A thermally-oxidized film 4 is next grown to, for example, 10 nm, so that the single-crystal Si layer 3 is covered with the thermally-oxidized film 4. A silicon nitride film 6 is then deposited by, for example, 20 nm. Photoresist is subsequently applied and then the silicon nitride film 6 is patterned. This exposes the silicon oxide film only on an end portion on a first side of the single-crystal Si layer 3 as shown in FIG. 7C. Thereafter, hydrogen annealing at a high temperature of, for example, 1050° C., is performed to etch Si. As described earlier, it is possible to etch the silicon oxide film only on edge portions of the single-crystal Si layer 3 by making use of the characteristic that etching starts with a peripheral portion for the patterned silicon oxide film 4. It is to be noted that an end portion on a second side of the single-crystal Si layer 3 is covered with the silicon nitride film 6. Accordingly, the silicon oxide film 4 is not etched. Through the foregoing steps, an opening 7 with Si exposed is formed only on the first side on both ends of the single-crystal Si layer 3 covered with the silicon oxide film 4 (FIG. 7D). The silicon nitride film 6 is selectively removed, using, for example, hot phosphoric acid (FIG. 7E). Si is next subjected to selective growth by using, for example, the $SiH_4$ gas (gas flow rate 20 sccm) and the HCl gas (gas flow rate 10 sccm) and under a condition of a growth temperature of 990° C. At this time, a good part of the substrate surface is covered with the silicon oxide film with Si exposed only partially. Si grows from a region of the opening 7 and Si in the reaction gas is consumed only in the region of the opening 7. Accordingly, a distribution of precipitous Si concentration is formed on the substrate surface. This distribution of Si concentration promotes lateral growth of Si. As a result, a single-crystal Si layer 5 is formed on the silicon oxide film 2 (FIG. 7F).

Figure 5E:
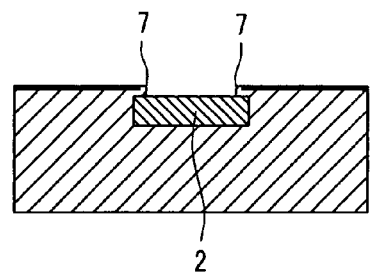
Figure 5F:
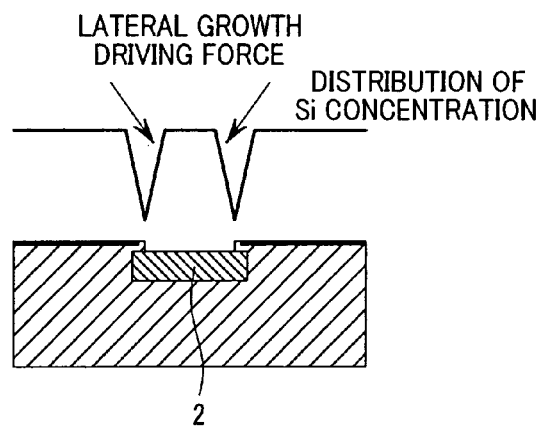
Figure 5G:
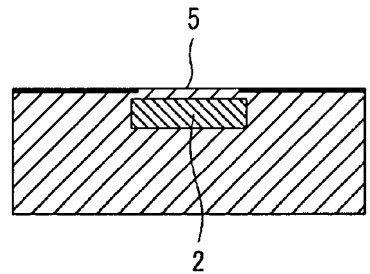

If the single-crystal Si is subjected to selective epitaxial growth by using the steps of the second embodiment of the present invention, there are two locations of the opening 7 at which the epitaxial growth of the single-crystal Si starts as shown in FIG. 5E. Accordingly, the growth of the single-crystal Si takes place independently at each of the plurality openings. There is therefore a possibility of dislocation or other crystal defect occurring at a location, at which grown films collide with each other. In accordance with the fourth embodiment of the present invention, on the other hand, there is no collision of single-crystal Si layers during the growth process, since there is only one opening 7. This makes it possible to manufacture the single-crystal Si layer 5 of even higher quality. To thin the single-crystal Si layer 5 down to a desired film thickness, the silicon oxide film, after being formed on the SOI substrate, is selectively removed by using fluorinated acid and the SOI layer is thereby thinned until the desired film thickness is reached. The use of the silicon oxide film, which has small variations in film thickness, for thinning the SOI layer enables manufacture of SOI substrates having outstanding uniformity.

The SOI structure is formed through the foregoing processes which allow the SOI structure to be formed on the bulk substrate. This makes it possible to provide SOI substrates at low cost. Further, the substrate is planarized through hydrogen annealing that offers high film thickness controllability, without using the CMP method. This allows SOI layers having no crystal defects and offering high crystal quality to be formed highly uniformly. The hydrogen annealing carried out at high temperature provides hydrogen termination for the Si surface, thus forming an SOI/embedded oxide film interface with a small interface state. As a result, SOI substrates can be manufactured at low cost and with high yield.

Fifth Embodiment

Figure 8:
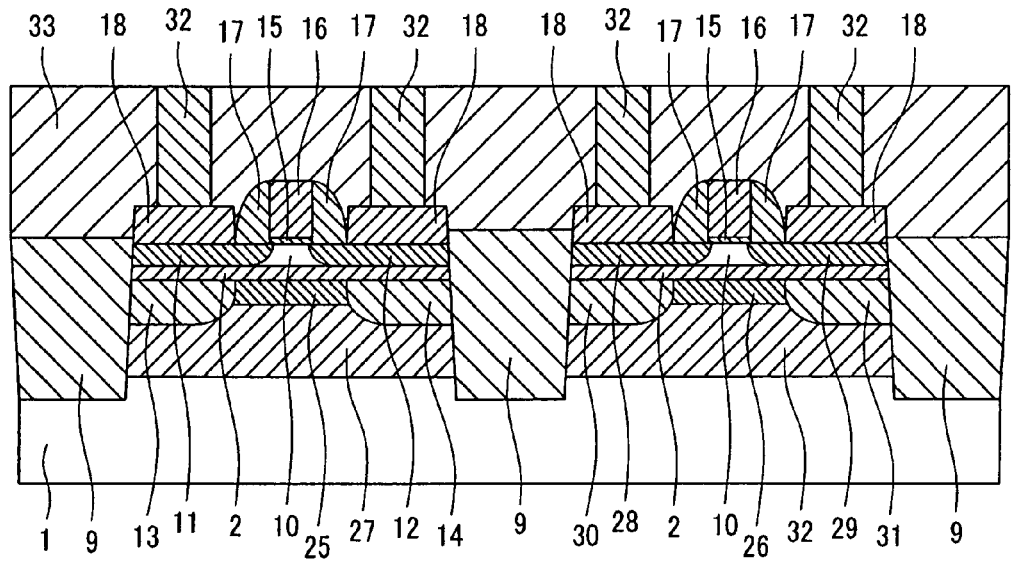
FIG. 8 is a cross-sectional view showing a completed MISFET according to a fifth embodiment of the present invention.
Figure 9:
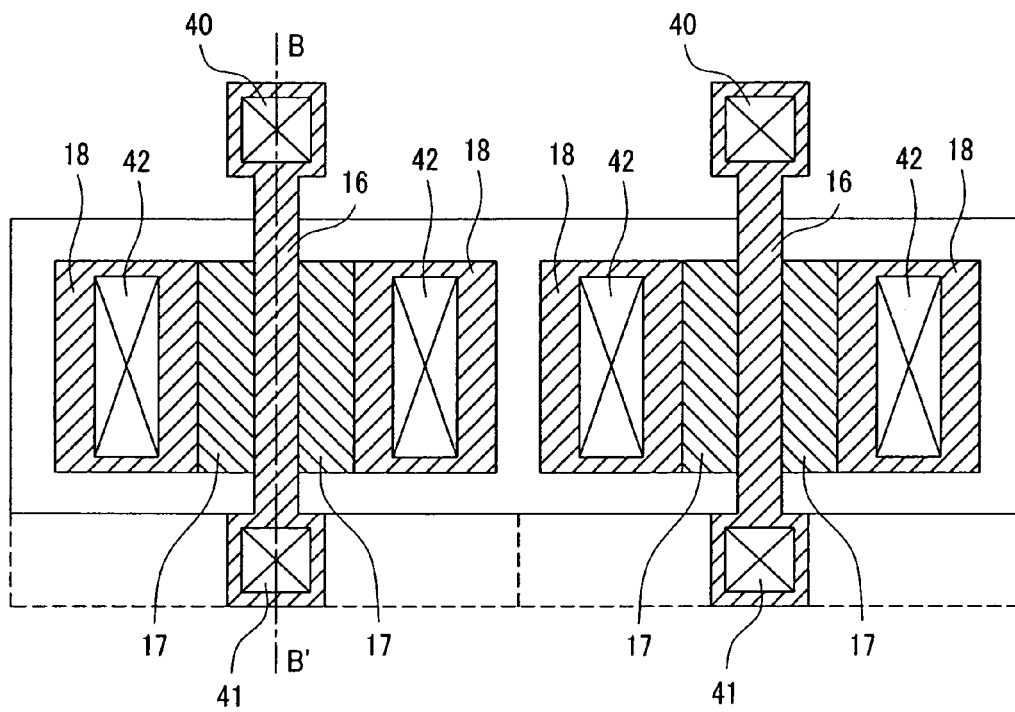
FIG. 9 is a layout view showing the MISFET according to the fifth embodiment of the present invention.
Figure 10A:
FIGS. 10A through 10I are views illustrating steps for manufacturing the MISFET according to the fifth embodiment of the present invention.
Figure 10B:
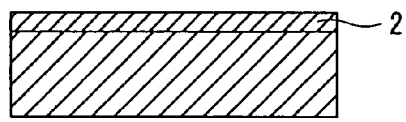
Figure 10C:
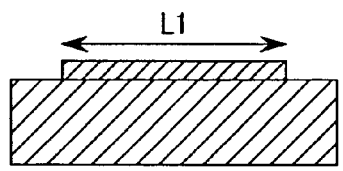
Figure 10D:
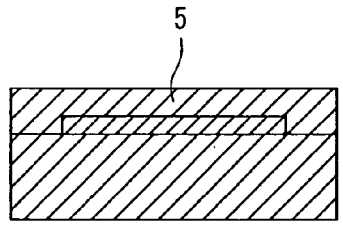
Figure 10E:
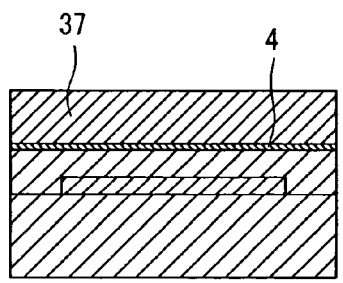
Figure 10F:
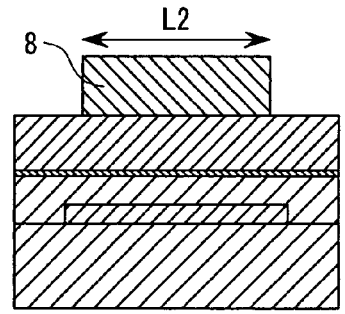
Figure 10G:
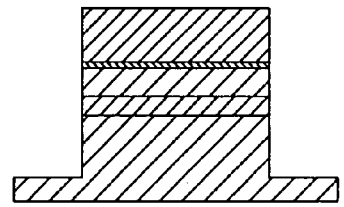
Figure 10H:
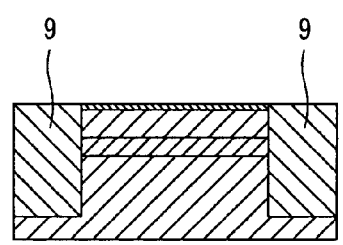
Figure 10I:
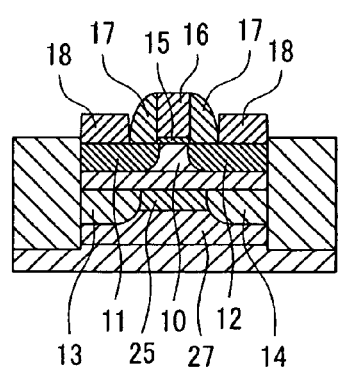

FIGS. 8 and 9 are a cross-sectional view and a plan view, respectively, showing a completed SOI type MISFET according to a fifth embodiment of the present invention. Manufacturing steps of the SOI type MISFET according to the fifth embodiment of the present invention will be described with reference to FIGS. 10A through 10I. A silicon oxide film 2 having a thickness, for example, of 10 nm is formed (FIG. 10B) as an embedded oxide film layer on a semiconductor substrate 1 (FIG. 10A) including a 20-cm-diameter single-crystal Si having a plain orientation (100), P-type conductivity, and a resistivity of 10 ohm.cm and having a main surface subjected to mirror polishing. Photoresist is subsequently applied and the silicon oxide film on a region on which the SOI structure is not to be formed is selectively removed (FIG. 10C). A single-crystal Si layer 5 is then epitaxially grown in accordance with the steps of the first embodiment of the present invention, thereby forming the SOI structure (FIG. 10D). The steps of the second, third, or fourth embodiment of the present invention may, instead, be used to grow the single-crystal Si layer 5 epitaxially. A silicon oxide film 4 and a silicon nitride film 37 are next formed (FIG. 10E). The silicon nitride film 37 formed in this step is used as a polishing stopper in the chemical mechanical polishing performed during a subsequent process of forming shallow trench isolation. A resist mask 8 is next applied and then resist is removed from only a region that serves as an active region of Si that forms a transistor (FIG. 10F). Then, the silicon nitride film 37 and the silicon oxide film 4 of any desired regions, and the single-crystal Si layer 1 are removed (FIG. 10G). For devices forming a pair of complementary MISFETs, patterning is performed such that the devices are disposed on the same well diffusion layer, which is followed by removal of resist mask. In a condition of FIG. 10G, a thin thermally-oxidized film is formed on the exposed Si region and a thick silicon oxide film with a thickness substantially equivalent what is needed to full a patterning region is deposited on the entire surface by using a known method of forming an isolation insulating film. Next, the thick silicon oxide film, which is exposed by selectively removing the silicon nitride film from a region selectively remained in the deposition of the silicon nitride film and the aforementioned patterning and from a region with a predetermined spacing from the region, is removed by using chemical mechanical polishing. Polishing ends with the silicon nitride film previously deposited and the silicon nitride film 37 left on the pattern. The silicon nitride film 37 and the like are next selectively removed, using hot phosphoric acid (FIG. 10H). At this time, a resist dimension L2 of FIG. 10F is made smaller than a resist dimension L1 during patterning of the silicon oxide film 2 in the step shown in FIG. 10C. The resist dimension L2 should preferably be made smaller by a degree that is greater than incorrect registration that would occur in a photolithography process. This arrangement ensures that both ends of the embedded oxide film formed in the silicon oxide film 2 in the step shown in FIG. 10E are properly etched in a Si etching process shown in FIG. 10G. This circumvents a problem, in which a region in which no embedded oxide films exist is produced, as a result of incorrect registration or other reasons, between the embedded oxide film 2 and an isolation region. Through the foregoing steps, an isolation region 9 of STI (Shallow Trench Isolation) is formed.

Referring to FIG. 10H, a P-type conductivity well diffusion layer 27, for example, is formed selectively in a desired region in a semiconductor substrate 1 through ion implantation performed via a thin silicon oxide film 4, a thin single-crystal Si layer 3, and a thin embedded insulating film 2. This is followed by formation of a threshold voltage control diffusion layer region 25 of an N-type conductivity SOI type MISFET forming region through ion implantation performed via the thin silicon oxide film 4, the thin single-crystal Si layer 3, and the thin embedded insulating film 2. The silicon oxide film 4 and the like are then selectively removed through cleaning with fluorinated acid or the like to expose a surface of the single-crystal Si thin film 3. Thereafter, a 1.8-nm-thick thermally-oxidized film is formed and a surface thereof is nitrided with NO gas to form and laminate a 0.2-nm-thick nitride film on the main surface, the nitride film being a gate insulating film 15. Subsequently, a polycrystalline Si film with a thickness, for example, of 100 nm is deposited on the gate insulating film 15 by the chemical vapor deposition method. A gate protective film mainly including a silicon nitride film is next deposited on an entire surface of the polycrystalline Si film before a gate electrode and a gate protective film are formed through patterning according to the known MISFET manufacturing method. Subsequently, the N-type conductivity SOI-MISFET region is subjected to ion implantation of, for example, As ions, with an implantation dose of $1\times10^{15}/cm^2$ and acceleration energy of 3 keV. An ultra-shallow N-type conductivity high concentration source diffusion layer 11 and an ultra-shallow N-type conductivity high concentration drain diffusion layer 12 are thereby formed on the main surface region of the single-crystal Si film 3. Subsequently, a silicon oxide film with a film thickness of, for example, 70 nm is deposited on the entire surface and then anisotropy dry etching is performed to let the silicon oxide film to remain selectively on a gate electrode sidewall portion, so that a gate sidewall insulating film 17 is formed. Subsequently performed is ion implantation of, for example, As ions, with an implantation dose of $4\times10^{15}/cm^2$ and acceleration energy of 25 keV by using the gate electrode and the gate sidewall insulating film 17 as ion implantation blocking masks. An N-type conductivity source diffusion layer region 13 and an N-type conductivity drain diffusion layer region 14, which are deeper than the regions of the ultra-shallow high concentration source diffusion layer 11 and drain diffusion layer 12, are thereby formed. It is to be noted that these deep source diffusion layer region 13 and the drain diffusion layer region 14 are formed in the SOI type MISFET region with the aim of reducing capacity of the source-drain diffusion layer region. These regions are formed through the same manufacturing method as the well-known method used for reducing junction capacity of the bulk type MISFET. Specifically, the regions are formed with the aim of forming an impurity-compensated region approximating an intrinsic region through the ion implantation incorporating the ion implantation blocking masks, in which ions of an opposite conductivity type are implanted at concentration and acceleration energy compensating for the ions for threshold voltage adjustment implanted earlier. Next, a Si film with a thickness of, for example, 60 nm is selectively deposited on an exposed single-crystal Si region using the selective epitaxial growth method. This step results in the single-crystal Si being selectively epitaxially grown on the source and drain diffusion layer regions. In this condition, the silicon nitride film on the gate electrode is selectively removed with the hot phosphoric acid to expose a silicon gate polycrystalline Si film. A 30-nm-thick Ni (nickel) film is then deposited over the entire surface through sputtering. The entire region of the exposed gate electrode, and at least an upper region of the N-type conductivity and P-type conductivity high concentration stack region are selectively silicified by heat treatment at 450° C., thereby providing a silicified gate electrode 16 and a silicified metal source/drain region 18. Through the foregoing selective silicification, the silicon gate electrode, to which impurities are yet to be added, is converted to a nickel silicide film up to a region thereof in contact with the gate insulating film, with a resultant lower resistance. Not all of stack Si film on the source-drain diffusion layer is silicified, with a low-resistant polycrystalline Si film remaining on a bottom surface region. The ultra-shallow N-type conductivity source diffusion layer 11 and the ultra-shallow N-type conductivity drain diffusion layer 12 are retained in the thin single-crystal Si. After the aforementioned silicification process, only the Ni film on the insulating film, which is yet to be reacted, is selectively removed by using an etching solution of a mixture of hydrochloric acid and hydrogen peroxide solution. Under this condition, deposition and flattening polishing are performed of interlayer insulating films and wiring processes including that for an interlayer insulating film 33 are performed. A second wiring process is thereafter performed to manufacture eventually the semiconductor device.

Through the foregoing steps, the SOI type MISFET is formed. In the semiconductor device according to the fifth embodiment of the present invention, the nickel silicide film is used for the gate electrode material in order to optimize the threshold value of the SOI type MISFET. It should, however, be noted that the gate electrode material is not limited to the nickel silicide film; rather, any material may be used as selected from among the metals of Ni, Co, Ti, W, Ta, Mo, Cr, Al, Pt, Pa, Ru, and the like, metal silicide films, and metal nitride films, as long as the material has a work function rated at substantially a median of a forbidden band of the single-crystal Si thin film.

FIGS. 10A through 10I show only the N-type conductivity MISFET. Similarly, the P-type conductivity MISFET can be manufactured. Through the foregoing processes, the complementary SOI type MISFET can be formed as shown in FIG. 8. Since the SOI structure is formed on the bulk substrate, it is possible to provide SOI substrates at low cost. Further, the substrate is planarized through hydrogen annealing that offers high film thickness controllability, without using the CMP method. This allows SOI layers having no crystal defects and offering high crystal quality to be formed highly uniformly. The hydrogen annealing carried out at high temperature provides hydrogen termination for the Si surface, thus forming an SOI/embedded oxide film interface with a small interface state. As a result, SOI type MISFETs can be manufactured at low cost and with high yield.

Sixth Embodiment

Figure 11A:
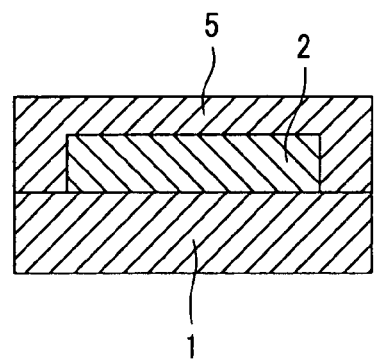
FIGS. 11A through 11C are views illustrating steps for manufacturing a MISFET according to a sixth embodiment of the present invention.
Figure 11B:
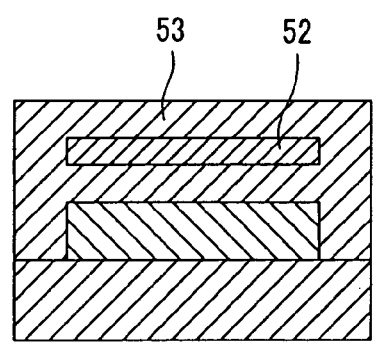
Figure 11C:
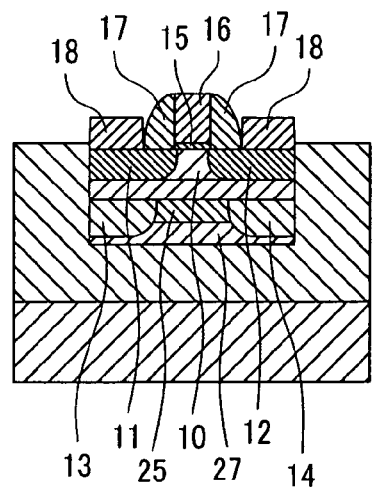

FIGS. 11A through 11C are views illustrating steps for manufacturing a SOI type MISFET according to a sixth embodiment of the present invention. Following the same steps as in the fifth embodiment of the present invention, a single-crystal Si layer 5 is epitaxially grown on a silicon oxide film 2 (FIG. 11A). Subsequently, the steps shown in FIGS. 10B through 10D of the fifth embodiment of the present invention are repeated to allow a single-crystal Si layer 53 to be epitaxially grown on a silicon oxide film 52. The foregoing steps form an SOI substrate having a dual structure of the embedded oxide film layer. The SOI type MISFET is then formed by thereafter using the same MISFET manufacturing steps described with reference to the fifth embodiment of the present invention. In the semiconductor device according to the sixth embodiment of the present invention, the nickel silicide film is used for the gate electrode material in order to optimize the threshold value of the SOI type MISFET. It should, however, be noted that the gate electrode material is not limited to the nickel silicide film; rather, any material may be used as selected from among the metals of Ni, Co, Ti, W, Ta, Mo, Cr, Al, Pt, Pa, Ru, and the like, metal silicide films, and metal nitride films, as long as the material has a work function rated at substantially a median of a forbidden band of the single-crystal Si thin film.

FIGS. 11A through 11C show only the N-type conductivity MISFET. Similarly, the P-type conductivity MISFET can be manufactured. Through the foregoing processes, the complementary SOI type MISFET can be formed. Since the SOI structure is formed on the bulk substrate, it is possible to provide SOI substrates at low cost. Further, the substrate is planarized through hydrogen annealing that offers high film thickness controllability, without using the CMP method. This allows SOI layers having no crystal defects and offering high crystal quality to be formed highly uniformly. The hydrogen annealing carried out at high temperature provides hydrogen termination for the Si surface, thus forming an SOI/embedded oxide film interface with a small interface state. Further, according to the sixth embodiment of the present invention, the embedded oxide film 52 of a dual structure and the embedded oxide film 2 are formed. Accordingly, a double gate structure, which permits even further miniaturization, may be provided by, for example, thinning the embedded oxide film 52 down to about 2 nm. In this case, by forming a thick embedded oxide film 2, increase in the parasitic capacitance as a result of thinning the embedded oxide film 52 can be suppressed. As a result, SOI type MISFETs can be manufactured at low cost and with high yield.

Seventh Embodiment

Figure 12:
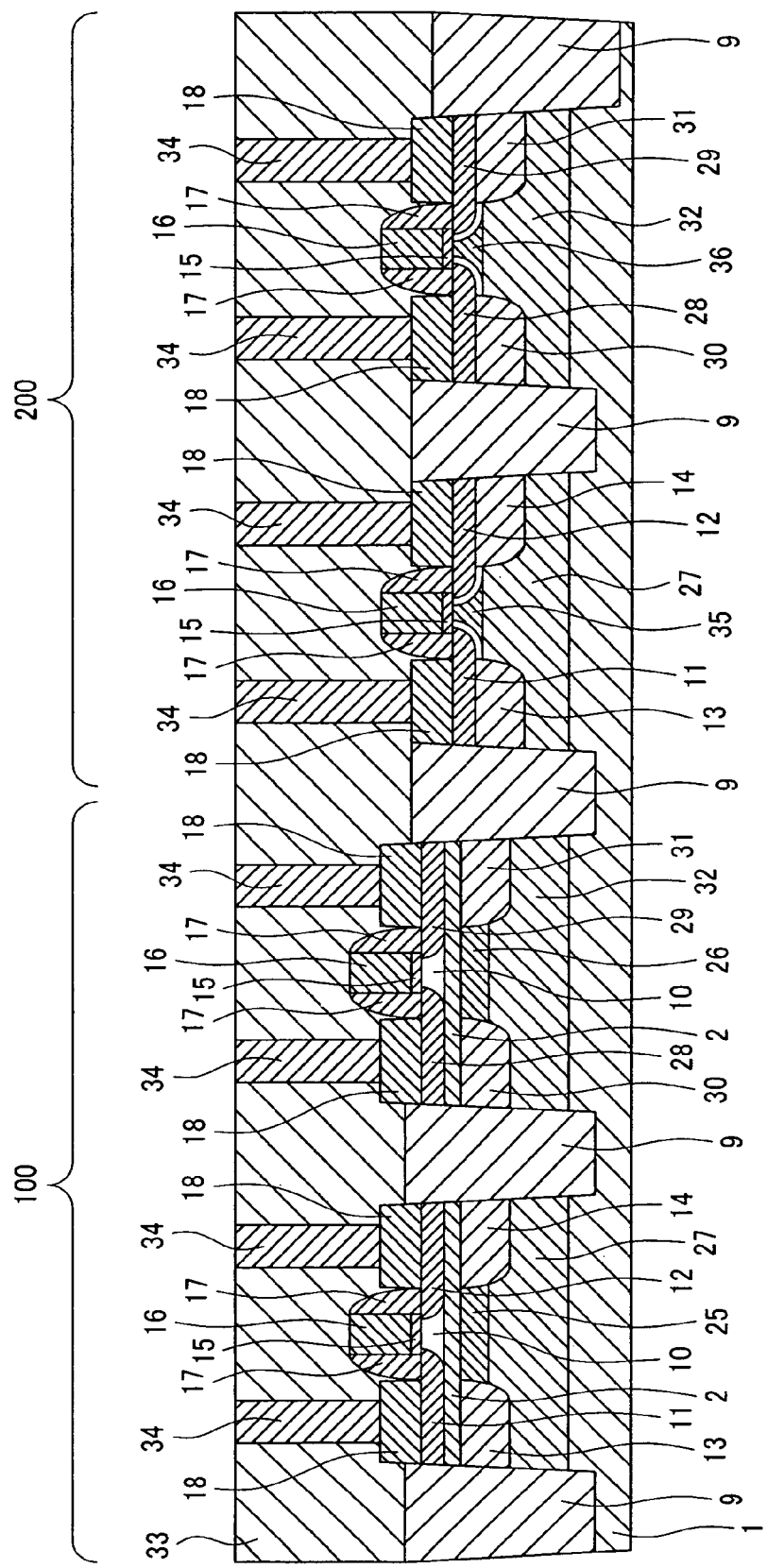
FIG. 12 is a cross-sectional view showing a completed MISFET according to a seventh embodiment of the present invention.
Figure 13A:
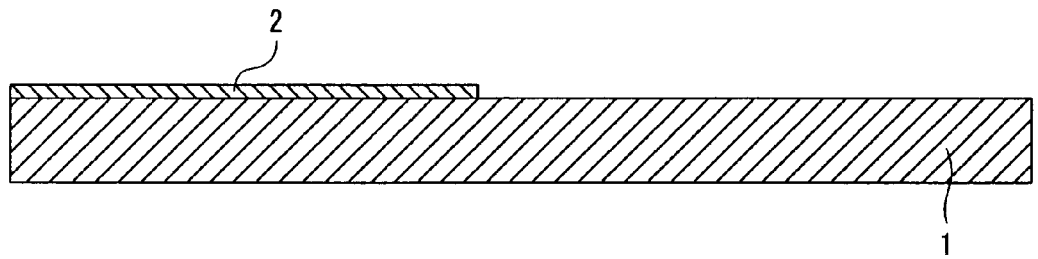
FIGS. 13A through 13D are views illustrating steps for manufacturing the MISFET according to the seventh embodiment of the present invention.
Figure 13B:
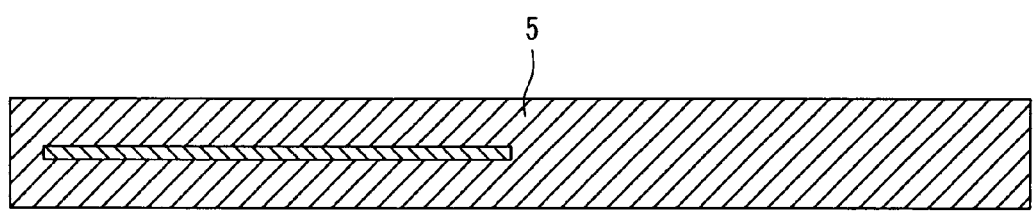
Figure 13C:
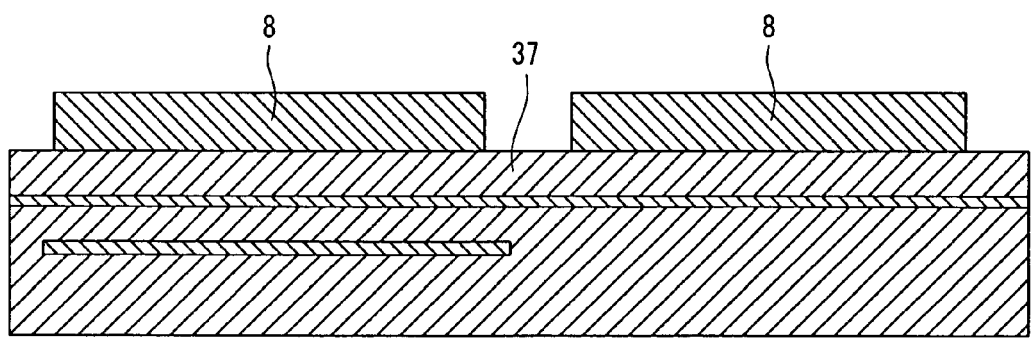
Figure 13D:
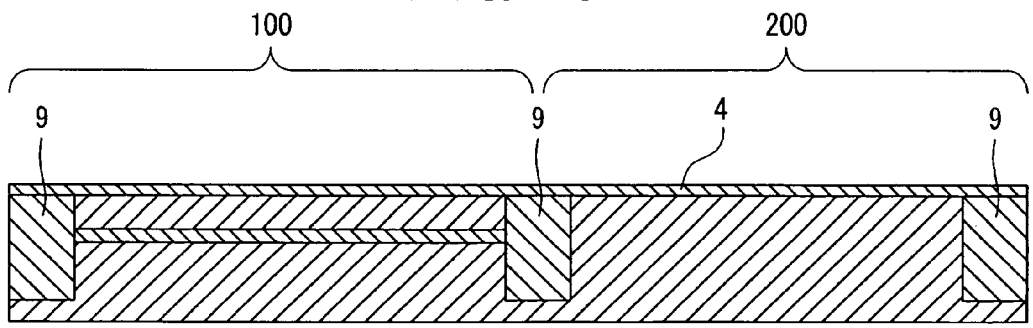

FIG. 12 is a cross-sectional view showing a completed MISFET according to a seventh embodiment of the present invention. Manufacturing steps of the MISFET according to the seventh embodiment of the present invention will be described with reference to FIGS. 13A through 13D. For the sake of convenience, the conductivity type of semiconductor substrates and semiconductor films is fixed; however, specific conductivity types may be combined in any arbitrary ways and are not limited to those described in the embodiments. A silicon oxide film 2 having a thickness, for example, of 10 nm is formed as an embedded oxide film layer on a semiconductor substrate 1 including a 20-cm-diameter single-crystal Si having a plain orientation (100), P-type conductivity, and a resistivity of 10 ohm.cm and having a main surface subjected to mirror polishing (FIG. 13A). A single-crystal Si layer 5 is next subjected to epitaxial growth to form an SOI structure according to the first embodiment of the present invention (FIG. 13B). At this time, the single-crystal Si layer 5 may be epitaxially-grown in accordance with the second, third, or fourth embodiment of the present invention. Subsequently, a silicon oxide film 4 and a silicon nitride film 37 are formed. The silicon nitride film 37 formed in this step is used as a polishing stopper in the chemical mechanical polishing performed during a subsequent process of forming shallow trench isolation. A resist mask 8 is next applied and then resist is removed from only a region that serves as an active region of Si that forms a transistor (FIG. 13C). Then, the silicon nitride film 37 and the silicon oxide film 4 of any desired regions, and the single-crystal Si layer 1 are removed. An isolation layer 9 is then formed, using the same step as in the fifth embodiment of the present invention based on a known method of forming an isolation insulating film (FIG. 13D). At this time, as described with reference to the fifth embodiment of the present invention, a resist dimension of FIG. 13C is made smaller than a resist dimension during patterning of the silicon oxide film 2 in the step shown in FIG. 13B.

The foregoing steps result in an SOI region 100 and a bulk region 200 being formed within the same substrate. A MISFET is to be next formed. Referring to FIG. 13D, a P-type conductivity well diffusion layer 27 is formed selectively in a desired region of a support substrate 1 through ion implantation in the SOI type MISFET forming region via the thin silicon oxide film 4, a thin single-crystal Si film 3, and a thin embedded insulating film 2 and in the bulk type MISFET forming region via the thin silicon oxide film 4. Subsequently, an N-type conductivity well diffusion layer 32 is formed selectively in a desired region of the support substrate 1 through ion implantation in the SOI type MISFET forming region via the thin silicon oxide film 4, the thin single-crystal Si film 3, and the thin embedded insulating film 2 and in the bulk type MISFET forming region via the thin silicon oxide film 4. Subsequently formed through ion implantation via the thin silicon oxide film 4, the thin single-crystal Si film 3, and the thin embedded insulating film 2 are threshold voltage control diffusion layer regions 25, 26 of N-type and P-type conductivity SOI type MISFET forming regions. Thereafter, N-type and P-type conductivity threshold voltage control diffusion layer regions 35, 36 are formed selectively in desired regions of the support substrate 1 through ion implantation in the N-type and P-type conductivity bulk type MISFET forming regions via a thin silicon oxide film 36. The silicon oxide film 4 and the like are then selectively removed through cleaning with fluorinated acid or the like to expose a surface of the single-crystal Si thin film 3. Thereafter, a 1.8-nm-thick thermally-oxidized film is formed and a surface thereof is nitrided with NO gas to form and laminate a 0.2-nm-thick nitride film on the main surface, the nitride film being a gate insulating film 15. Subsequently, a polycrystalline Si film with a thickness, for example, of 100 nm is deposited on the gate insulating film 15 by the chemical vapor deposition method. A gate protective film mainly including a silicon nitride film is next deposited on an entire surface of the polycrystalline Si film before a gate electrode and a gate protective film are formed through patterning according to the known MISFET manufacturing method.

Subsequently, the N-type conductivity SOI and bulk type MISFET regions are subjected to ion implantation of, for example, As ions, and the P-type conductivity SOI and bulk type MISFET regions are subjected to ion implantation of, for example, $BF_2$ ions, with an implantation dose of $1\times10^{15}/cm^2$ and acceleration energy of 1 keV and 600 eV, respectively. An ultra-shallow N-type conductivity high concentration source diffusion layer 11, an ultra-shallow N-type conductivity high concentration drain diffusion layer 12, an ultra-shallow P-type conductivity high concentration source diffusion layer 28, and an ultra-shallow P-type conductivity high concentration drain diffusion layer 29 are thereby simultaneously formed on the main surface region of the single-crystal Si film 3. There is no step existing between the SOI type MISFET forming region and the bulk type MISFET forming region. Accordingly, common ion implantation conditions can be set for forming the ultra-shallow high concentration source and drain diffusion layers of the SOI type MISFET forming region and the bulk type MISFET forming region. This allows the ultra-shallow high concentration source and drain diffusion layers for the SOI type MISFET and the bulk type MISFET to be formed with the same process. Subsequently, the N-type conductivity bulk type MISFET region 100 is subjected to ion implantation of, for example, B ions with an implantation dose of $1\times10^{13}/cm^2$ and acceleration energy of 10 keV. Similarly, the P-type conductivity MISFET region is subjected to ion implantation of, for example, P ions with an implantation dose of $1\times10^{13}/cm^2$ and acceleration energy of 10 keV by using the gate protective insulating film as an ion implantation blocking mask. A halo region is thereby formed. This represents an ion implantation process performed to suppress the short channel effect of the bulk type MISFET. It should be noted that, for even greater short channel effect suppression effect, oblique ion implantation with a tilt angle of 20° may, for example, be set for the halo forming condition.

Subsequently, a silicon oxide film with a film thickness of, for example, 70 nm is deposited on the entire surface and then anisotropy dry etching is performed to let the silicon oxide film to remain selectively on a gate electrode sidewall portion, so that a gate sidewall insulating film 17 is formed. Subsequently, the N-type conductivity SOI and bulk type MISFET regions are subjected to ion implantation of, for example, As ions, and the P-type conductivity SOI and bulk type MISFET regions are subjected to ion implantation of, for example, $BF_2$ ions, with an implantation dose of $4\times10^{15}/cm^2$ and acceleration energy of 25 keV and 15 eV, respectively, by using the gate electrode and the gate sidewall insulating film 17 as ion implantation blocking masks. An N-type conductivity source diffusion layer region 13 and an N-type conductivity drain diffusion layer region 14, which are deeper than the regions of the ultra-shallow high concentration source diffusion layer 11 and drain diffusion layer 12, and a P-type conductivity source diffusion layer region 30 and a P-type conductivity drain diffusion layer region 31 are thereby formed respectively. It is to be noted that these deep source diffusion layer region 13 and the drain diffusion layer region 14 are formed in the SOI type MISFET region with the aim of reducing capacity of the source-drain diffusion layer region. These regions are formed through the same manufacturing method as the well-known method used for reducing junction capacity of the bulk type MISFET. Specifically, the regions are formed with the aim of forming an impurity-compensated region approximating an intrinsic region through the ion implantation incorporating the ion implantation blocking masks, in which ions of an opposite conductivity type are implanted at concentration and acceleration energy compensating for the ions for threshold voltage adjustment implanted earlier. The bulk type MISFET, on the other hand, is formed with the aim of forming the low-resistant source-drain diffusion regions through the same process as the well-known one for the bulk type MISFET source-drain diffusion layer regions.

As described in the foregoing, in accordance with the seventh embodiment of the present invention, the common process under the same conditions can be used for the ion implantation for reducing the parasitic capacitance of the source and drain diffusion layer regions of the SOI type MISFET region and for the ion implantation for reducing resistance of the source and drain diffusion layer regions of the bulk type MISFET region. This contributes to a simplified process.

Next, a Si film with a thickness of, for example, 60 nm is selectively deposited on an exposed single-crystal Si region using the selective epitaxial growth method. This step results in the single-crystal Si being selectively epitaxially grown on the source and drain diffusion layer regions. Subsequently, the silicon nitride film on the gate is selectively removed with the hot phosphoric acid to expose a silicon gate polycrystalline Si film. A 30-nm-thick Ni (nickel) film is then deposited over the entire surface through sputtering. The entire region of the exposed gate electrode, and at least an upper region of the N-type conductivity and P-type conductivity high concentration stack region are selectively silicified by heat treatment at 450° C., thereby providing a silicified gate electrode 16 and a silicified metal source/drain region 18. Through the foregoing selective silicification, the silicon gate electrode, to which impurities are yet to be added, is converted to a nickel silicide film up to a region thereof in contact with the gate insulating film, with a resultant lower resistance. Not all of stack Si film on the source-drain diffusion layer is silicified, with a low-resistant polycrystalline Si film remaining on a bottom surface region. The ultra-shallow N-type conductivity source diffusion layer 11 and the ultra-shallow N-type conductivity drain diffusion layer 12, and the shallow P-type conductivity source diffusion layer 28 and the P-type conductivity drain diffusion layer 29 are retained in the thin single-crystal Si. After the aforementioned silicification process, only the Ni film on the insulating film, which is yet to be reacted, is selectively removed by using an etching solution of a mixture of hydrochloric acid and hydrogen peroxide solution. Under this condition, deposition and flattening polishing are performed of interlayer insulating films and wiring processes including that for an interlayer insulating film 33 are performed. A second wiring process is thereafter performed to manufacture eventually the semiconductor device (FIG. 12).

Through the foregoing steps, the SOI type MISFET and the bulk type MISFET are formed on the SOI region 100 and the bulk region 200, respectively. In the semiconductor device according to the seventh embodiment of the present invention, the nickel silicide film is used for the gate electrode material in order to optimize the threshold value of the SOI type MISFET. It should, however, be noted that the gate electrode material is not limited to the nickel silicide film; rather, any material may be used as selected from the among metals of Ni, Co, Ti, W, Ta, Mo, Cr, Al, Pt, Pa, Ru, and the like, metal silicide films, and metal nitride films, as long as the material has a work function rated at substantially a median of a forbidden band of the single-crystal Si thin film.

In accordance with the seventh embodiment of the present invention, the SOI type MISFET is formed on the bulk substrate. This makes it possible to provide SOI substrates at low cost. Further, the substrate is planarized through hydrogen annealing that offers high film thickness controllability, without using the CMP method. This allows SOI layers having no crystal defects and offering high crystal quality to be formed highly uniformly. The hydrogen annealing carried out at high temperature provides hydrogen termination for the Si surface, thus forming an SOI/embedded oxide film interface with a small interface state. As a result, SOI type MISFETs can be manufactured at low cost and with high yield. Furthermore, according to the seventh embodiment of the present invention, the high performance SOI type MISFET 100, high blocking voltage devices, and the ESD protective bulk type MISFET 200 for preventing ESD (electrostatic discharge) breakdown can be formed on the same substrate and freely in desired respective regions. In addition, the process for manufacturing the SOI type MISFET is also used for manufacturing the bulk type MISFET. This achieves a compact semiconductor device and simplified manufacturing processes.

Figure 14:
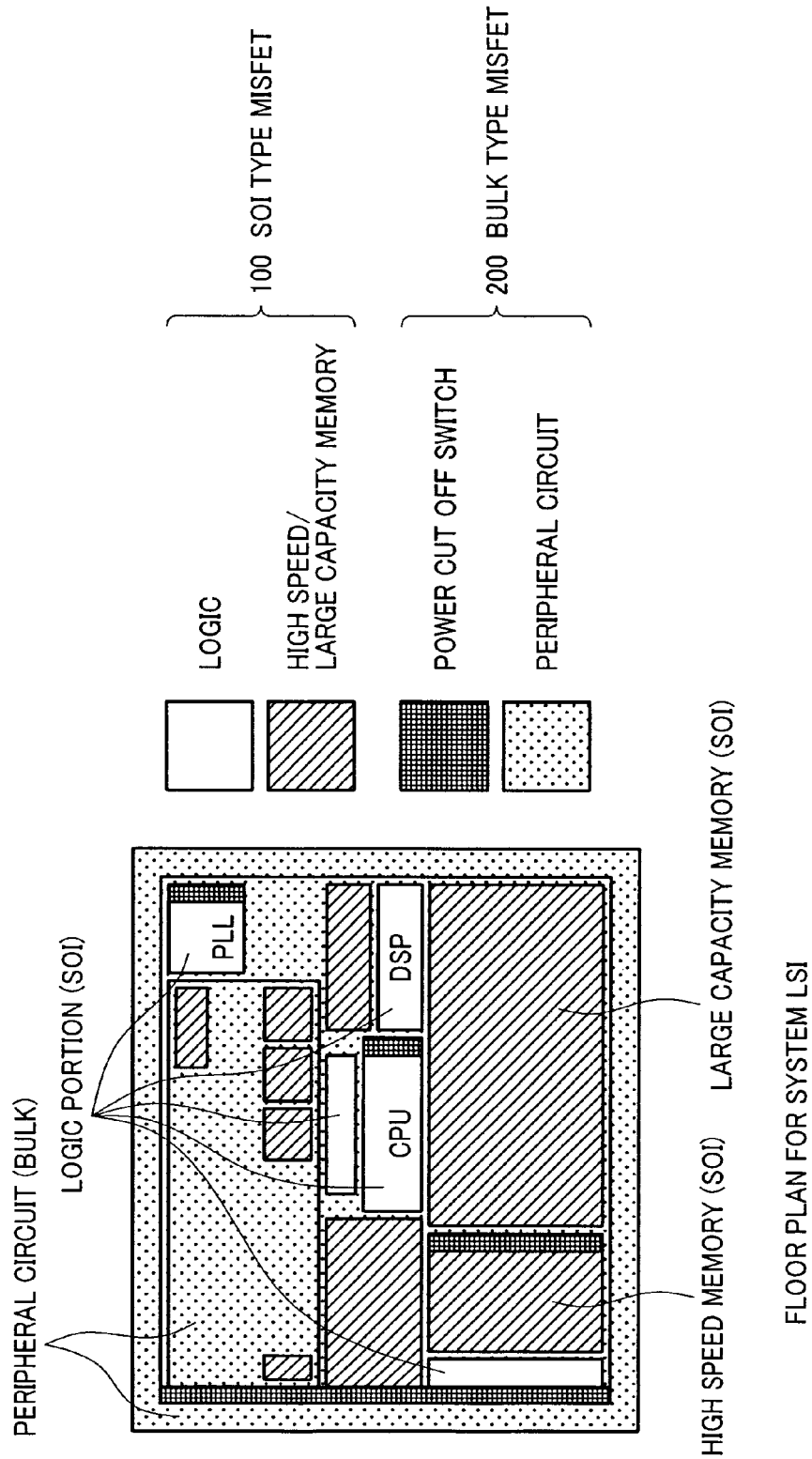
FIG. 14 is a view showing a typical floor plan of a semiconductor device manufactured according to a preferred embodiment of the present invention.
Figure 15:
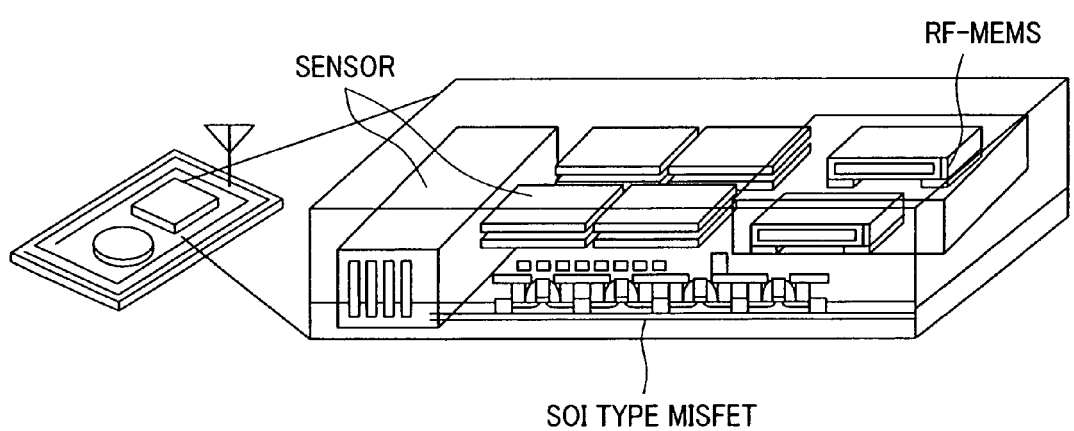
FIG. 15 is a view showing a typical semiconductor device mounted also with a MEMS, manufactured according to the preferred embodiments of the present invention.

FIG. 14 is a view showing a typical floor plan of a semiconductor device manufactured according to the seventh embodiment of the present invention. It becomes possible to manufacture high performance system LSIs by manufacturing logic circuits, of which high performance is required, and high-speed/large-capacity memories using the SOI type MISFETs and power shutdown switches and peripheral circuits requiring high blocking voltage devices using the bulk type MISFETs. FIG. 15 is a view showing a typical semiconductor device mounted also with MEMS (Micro-Electro-Mechanical Systems). An integrated circuit merged with high performance MEMS can be provided at low cost by manufacturing LSIs requiring high-speed processing using SOI type MISFETs and forming MEMS including RF modules and sensors in the bulk region.

What is claimed is:

1. A method of manufacturing a semiconductor device, comprising the steps of:
    forming a first insulator layer on a surface of a semiconductor substrate;
    patterning a first mask member deposited on the first insulator layer into a desired shape;
    forming a first window, through which the surface of the semiconductor substrate is exposed, by selectively removing the first insulator layer, using the patterned first mask member;
    introducing the semiconductor substrate into a chamber for performing an epitaxial growth and epitaxially growing, as a first substep of the epitaxial growth, the surface of the semiconductor substrate exposed through the first window as a seed crystal to thereby fill the first window with a first epitaxial layer including a semiconductor layer;
    epitaxially growing, as a second substep of the epitaxial growth, a second epitaxial layer such that the first epitaxial layer and the first insulator layer are covered, in a condition in which the semiconductor substrate is retained in the chamber, subsequent to the first substep of epitaxial growth; and
    etching to flatten the second epitaxial layer in the condition in which the semiconductor substrate is retained in the chamber, subsequent to the second substep of the epitaxial growth,
    wherein the second substep of the epitaxial growth and the etching are performed without allowing a temperature in the chamber during the second substep of the epitaxial growth and the etching to be decreased from a temperature of the chamber during the first substep of epitaxial growth, and
    wherein an HCl gas is not introduced into the chamber during the first substep of the epitaxial growth, while the HCl gas is introduced into the chamber during the second substep of the epitaxial growth.

2. The method of claim 1,
    wherein an upper end portion of a surface of the first insulator layer patterned to the desired shape is covered with the first epitaxial layer.

3. The method of claim 1,
    wherein each of the steps from forming the first insulator layer to etching the second epitaxial layer is performed in the successive sequence set forth repeatedly a plurality of times to form a plurality of SOI layers in the semiconductor substrate.

* * * * *